(12) United States Patent
Franklin et al.

(10) Patent No.: US 7,578,302 B2
(45) Date of Patent: Aug. 25, 2009

(54) MEGASONIC CLEANING USING SUPERSATURATED SOLUTION

(75) Inventors: Cole S. Franklin, San Clemente, CA (US); Yi Wu, Irvine, CA (US); Brian Fraser, Los Angeles, CA (US)

(73) Assignee: Akrion Systems, LLC

( * ) Notice: Subject to any disclaimer, the term of this patent is extended or adjusted under 35 U.S.C. 154(b) by 246 days.

(21) Appl. No.: 11/595,029

(22) Filed: Nov. 9, 2006

(65) Prior Publication Data

US 2007/0056605 A1    Mar. 15, 2007

Related U.S. Application Data

(60) Division of application No. 10/864,929, filed on Jun. 10, 2004, now Pat. No. 7,156,111, application No. 11/595,029, which is a continuation-in-part of application No. 10/931,457, filed on Sep. 1, 2004, now abandoned, which is a continuation-in-part of application No. 10/742,214, filed on Dec. 19, 2003, now Pat. No. 7,047,989, which is a continuation of application No. 09/906,384, filed on Jul. 16, 2001, now Pat. No. 6,684,890.

(60) Provisional application No. 60/477,602, filed on Jun. 11, 2003.

(51) Int. Cl.
*B08B 3/00*    (2006.01)

(52) U.S. Cl. ............................. 134/1.3; 134/1; 134/34; 134/42; 438/906

(58) Field of Classification Search .................. 134/1.3; 438/902

See application file for complete search history.

(56) References Cited

U.S. PATENT DOCUMENTS 4,537,511 A    8/1985    Frei (Continued)

FOREIGN PATENT DOCUMENTS

JP    S61-16528    1/1985

(Continued)

OTHER PUBLICATIONS

Nicholosi et al. "Front End of Line Wet Processing for Advanced Critical Cleans," Electrochemical Society Proceedings Honolulu (1999).

(Continued)

*Primary Examiner*—Michael Kornakov
*Assistant Examiner*—Ryan Coleman
(74) *Attorney, Agent, or Firm*—The Belles Group P.C.

(57) ABSTRACT

A method and system for the megasonic cleaning of one or more substrates that reduces damage to the substrate(s) resulting from the megasonic energy. The substrates are supported in a process chamber and contacted with a cleaning solution comprising a cleaning liquid having carbon dioxide gas dissolved in the cleaning liquid in such amounts that the carbon dioxide gas is at a supersaturated concentration for the conditions within the process chamber. Megasonic energy is then transmitted to the substrate. The cleaning solution provides protection from damage resulting from the application of megasonic/acoustical energy. The invention is not limited to carbon dioxide but can be used in conjunction with any gas that, when so dissolved in a cleaning liquid, protects substrates from being damaged by the application of megasonic/acoustical energy.

4 Claims, 4 Drawing Sheets

U.S. PATENT DOCUMENTS

| | | |
|---|---|---|
| 5,427,622 A | 6/1995 | Stanaslovich et al. |
| 5,562,778 A * | 10/1996 | Koretsky et al. ............... 134/1 |
| 5,656,097 A | 8/1997 | Olesen et al. |
| 5,800,626 A | 9/1998 | Cohen et al. |
| 5,849,091 A | 12/1998 | Skrovan |
| 5,985,811 A | 11/1999 | Masayuki et al. |
| 6,039,059 A | 3/2000 | Bran |
| 6,039,814 A | 3/2000 | Ohmi |
| 6,140,744 A | 10/2000 | Bran |
| 6,167,891 B1 | 1/2001 | Kudelka |
| 6,325,081 B1 | 12/2001 | Miki |
| 6,450,181 B1 | 9/2002 | Morita |
| 6,491,763 B2 | 12/2002 | Verhaverbeke |
| 6,539,952 B2 | 4/2003 | Itzkowitz |
| 6,684,890 B2 | 2/2004 | Nicolosi et al. |
| 6,790,783 B1 | 9/2004 | Gilton |
| 6,848,455 B1 | 2/2005 | Shrinivasan et al. |
| 2002/0029788 A1 | 3/2002 | Verhaverbeke et al. |
| 2002/0063169 A1 | 5/2002 | Verhaverbeke et al. |
| 2002/0064961 A1 | 5/2002 | Verhaverbeke et al. |
| 2003/0015216 A1 | 1/2003 | Nicolosi |
| 2004/0029388 A1 | 2/2004 | Verhaverbeke et al. |

FOREIGN PATENT DOCUMENTS

| | | |
|---|---|---|
| JP | 09-213666 | 8/1997 |
| JP | 11008214 | 1/1999 |
| JP | 2000150439 | 5/2000 |
| JP | 2000325902 | 11/2000 |
| WO | WO 98/01896 | 1/1998 |

OTHER PUBLICATIONS

Yi Wu "Development of an Experimentally Validated Model of Megasonic Cleaning" Doctoral Thesis 1997.

"Study on Megasonic in Advanced Wet Cleaning Process," Electrochemical Society Proceedings vol. 95-20 (Oct. 1995).

"Ultra Pure Water Monitoring Guidelines 2000," Balazs Analytical Laboratory, 1999.

* cited by examiner

Figure 4B (Invention)

MEGASONIC CLEANING USING SUPERSATURATED SOLUTION

CROSS-REFERENCE TO RELATED APPLICATIONS

This application is a divisional application of U.S. patent application Ser. No. 10/864,929 filed Jun. 10, 2004, now U.S. Pat. No. 7,156,111, which in turn claims benefit of U.S. Provisional Patent Application 60/477,602, filed Jun. 11, 2003, and is also a continuation-in-part of U.S. patent application Ser. No. 10/931,457, filed Sep. 1, 2004, now abandoned, which is a continuation-in-part of U.S. patent application Ser. No. 10/742,214, filed Dec. 19, 2003, now issued as U.S. Pat. No. 7,047,989 which is a continuation application of U.S. patent application Ser. No. 09/906,384, filed on Jul. 16, 2001, now issued as U.S. Pat. No. 6,684,890, the entireties of which are hereby incorporated by reference.

FIELD OF THE INVENTION

The present invention relates generally to the methods for substrate processing/manufacturing, and specifically to methods for cleaning semiconductor wafers using applied megasonic energy.

BACKGROUND OF THE INVENTION

In the manufacture of semiconductors, semiconductor devices are produced on thin disk-like objects called wafers. Generally, each wafer contains a plurality of semiconductor devices. The importance of minimizing contaminants on the surface of these wafers during production has been recognized since the beginning of the industry. Moreover, as semiconductor devices become more miniaturized and complex due to end product needs, the cleanliness requirements have become more stringent. This occurs for two reasons.

First, as devices become miniaturized, a contaminating particle on a wafer will occupy a greater percentage of the device's surface area. This increases the likelihood that the device will fail. As such, in order to maintain acceptable output levels of properly functioning devices per wafer, increased cleanliness requirements must be implemented and achieved.

Second, as devices become more complex, the raw materials, time, equipment, and processing steps necessary to make these devices also become more complex and more expensive. As a result, the cost required to make each wafer increases. In order to maintain acceptable levels of profitability, it is imperative to manufacturers that the number of properly functioning devices per wafer be increased. One way to increase this output is to minimize the number of devices that fail due to contamination. Thus, increased cleanliness requirements are desired.

One method by which the industry increases the cleanliness of wafers during processing is by introducing megasonic energy to the surface of the wafers during the cleaning step. Applying megasonic energy can enhance particle removal from semiconductor devices during cleaning processes. However, it has been discovered that applied megasonic energy can also damage the semiconductor devices being cleaned. The composition of the cleaning solution, including the quantity and composition of any gas dissolved in the cleaning solution, used in a megasonic cleaning process can affect cleaning efficiency and the amount of damage caused to the wafer. The prior art teaches that cleaning solutions containing supersaturated levels of gas are undesirable for wafer cleaning processes.

For example, U.S. Pat. No. 5,800,626 (the "'626 patent") teaches that the cleaning solution should be partially saturated, e.g., 60-98% with gas, in order to achieve the best cleaning results. The '626 patent teaches that a lower saturation limit of 60% is required in order to maintain good cleaning performance. The '626 patent further teaches that too much gas in solution can create defects in silicon surfaces. Therefore, the cleaning solution should not be more than 98% saturated.

U.S. Pat. No. 6,167,891 (the "'891 patent") teaches that a 100% saturated solution provides optimal cleaning efficiency. According to the '891 patent, under-saturated and supersaturated solutions provide significantly decreased cleaning efficiencies. The '891 patent attributes poor cleaning efficiency at supersaturated conditions to the formation of excessive gas bubbles in the solution that absorb the megasonic energy before it reaches the wafer surface. The '891 patent further teaches that for heated cleaning solutions, the solution must be partially degassed at low temperature before being heated in order to avoid supersaturation at the elevated temperature.

U.S. Pat. No. 5,849,091 (the "'091 patent") teaches that an air/liquid interface across the wafer surface is critical to enhancing cleaning. However, the inventors of the '091 patent teach that the best method of forming the air/liquid interface is by directly injecting gas into the cleaning solution across the wafer surface.

U.S. Pat. No. 6,039,814 (the "'814 patent") teaches that minute bubbles within the cleaning solution disrupt the propagation of sound, resulting in reduced cleaning efficiency. The '814 patent also teaches that bubbles create flaws in the wafer surface. The source of the bubbles is gas dissolved in the cleaning solution. Therefore, the '814 patent teaches, dissolved gas concentration in the cleaning solution should be below at least 5 ppm, and preferably below 3 ppm.

SUMMARY OF THE INVENTION

It is therefore an object of the present invention to provide a method for cleaning a substrate.

Another object of the present invention to provide a method for cleaning a substrate that reduces and/or eliminates damage resulting from acoustical energy.

Yet another object is to provide a method for cleaning a substrate using megasonic energy that can be used for sensitive line and trench structures of materials including poly silicon, metal or dielectric.

Still another object of the present invention is to provide a method for cleaning a substrate that increases the yield of operational semiconductor devices per wafer.

These and other objects are met by the present invention which in one aspect is a method of cleaning at least one substrate comprising: (a) positioning a substrate in a process chamber having a gaseous environment with a first temperature and a first partial pressure for a first gas; (b) supplying a solution to the process chamber so as to contact the substrate, the solution comprising a cleaning liquid and the first gas dissolved in the cleaning liquid at a supersaturated concentration for the first temperature and the first partial pressure; and (c) applying acoustical energy to the substrate to clean the substrate while the substrate is in contact with the solution.

The first gas is preferably a gas that protects the substrate from damage resulting from the acoustical energy, such as carbon dioxide. The cleaning liquid can be commonly used semiconductor solutions such as deionized water, RCA solutions, dilute acids, dilute bases or semi-aqueous solvents. It is further preferable that the solution further comprises a second gas dissolved in the cleaning liquid that promotes particle removal from the substrate, such as nitrogen ($N_2$), oxygen, helium, and argon. The second gas may or may not be dissolved in the cleaning liquid in an amount to be at a supersaturated concentration for the temperature and partial pressure of the second gas within the process chamber.

In a preferred embodiment, the first gas is carbon dioxide and the liquid is DI water. The solution can be created in a environment other than the process chamber, such as a membrane contactor, by dissolving $CO_2$ in DI water. During the dissolution of the $CO_2$ in the DI water in this embodiment, a gaseous environment within the membrane contactor is preferably maintained at a temperature and a partial pressure for $CO_2$ that that the amount of $CO_2$ dissolved in the DI water in the membrane contactor is at or below the saturation concentration for the temperature and partial pressure within the membrane contactor. The amount of the carbon dioxide dissolved in the liquid can be the range of 50 to 2000 part per million, and most preferably approximately 1000 parts per million.

Despite the amount of $CO_2$ dissolved in the DI water being at or below the saturation concentration for the partial pressure of $CO_2$ and temperature within the membrane concentrator, this amount of $CO_2$ in the DI water is at a supersaturated concentration for the partial pressure of $CO_2$ and temperature in the process chamber.

Once created with the desired concentration in the membrane contactor, the solution is supplied to the process chamber so as to contact the substrate(s) to be cleaned. Because the amount of $CO_2$ in the solution is at a supersaturated concentration for the partial pressure and temperature of the gaseous environment in the process chamber, the $CO_2$ will have a tendency to escape from the solution and into the gaseous atmosphere of the process chamber. Thus, it is preferable that the step of applying acoustical energy to the substrate be completed before enough of the $CO_2$ escapes from the solution to lower the concentration of the $CO_2$ dissolved in the DI water to a saturation concentration for the temperature and partial pressure of $CO_2$ within the process chamber.

The environment within the process chamber is preferably a gaseous environment comprising air or $N_2$ and is at room temperature and atmospheric pressure. It is further preferred that the acoustical energy supplied to the substrate be megasonic energy and that the substrate be a semiconductor wafer.

It is also preferred that the acoustic energy be transmitted through the solution and to the substrate. As a result of the protective effect of the $CO_2$, the method of invention can be used to apply megasonic energy during the cleaning steps of a semiconductor wafer with minimal damage to the wafer containing sensitive line and trench structures of materials including poly Si, metal or dielectric.

This method of invention can be also used to clean substrates in both non-immersion and immersion type process chambers and can be used in single and batch type substrate processing. When implemented into a non-immersion type process chamber, the substrate can be supported in a substantially horizontal orientation. In this embodiment, the solution is preferably supplied to the process chamber so as to form a layer of the solution on at least one surface of the substrate. The acoustical energy is then preferably transmitted through the solution and to the substrate. In comparison, when used with immersion type process chambers, the substrate will be submerged in the solution.

In another aspect, the invention is a method of cleaning at least one semiconductor wafer comprising: (a) positioning a semiconductor wafer in a process chamber; (b) supplying a solution to the process chamber so as to contact the substrate, the solution comprising a cleaning liquid and a first and second gases dissolved in the cleaning liquid, wherein the first gas promotes particle removal from the wafer and the second gas protects the wafer from damage resulting from acoustical energy; and (c) applying acoustical energy through the solution and to the wafer to clean the wafer.

BRIEF DESCRIPTION OF THE DRAWINGS

FIG. 4B is microscopic image of a non-damaged semiconductor wafer surface with etched lines that was cleaned according to an embodiment of the present invention.

DETAILED DESCRIPTION OF THE DRAWINGS

The described embodiments of the megasonic cleaning method of the present invention have several features, no single one of which is solely responsible for the desirable attributes. Without limiting the scope of this method as expressed by the claims that follow, its more prominent features will now be discussed.

Efficiently cleaning semiconductor wafers using applied megasonic energy requires a proper concentration of dissolved gas in the cleaning solution. However, contrary to the teachings of the prior art, optimum cleaning with no wafer damage results from using a cleaning solution having a supersaturated concentration of dissolved gas. The methods of the present invention described herein are effective for cleaning wafers using both immersion and non immersion cleaning techniques. The wafer or wafers being cleaned may be immersed in cleaning solution or, alternatively, cleaning solution may be applied to the wafer surface as a thin film, by such means as spraying.

Figure 1:
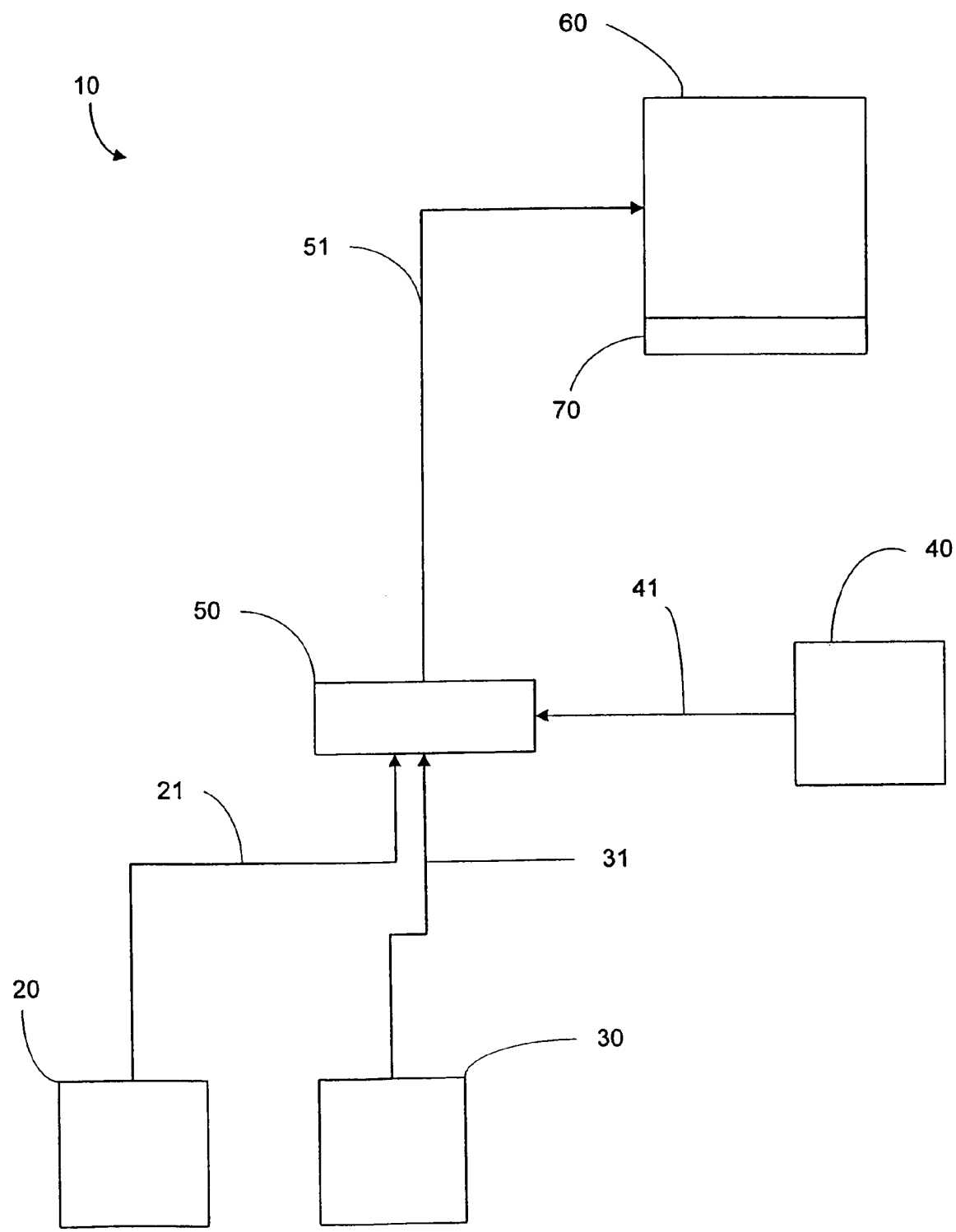
FIG. 1 is a schematic of a megasonic cleaning system according to an embodiment of the invention.

Referring to FIG. 1, megasonic cleaning system 10 is illustrated according to an embodiment of the present invention. Megasonic cleaning system 10 comprises $CO_2$ gas source 20, nitrogen ($N_2$) gas source 30, cleaning liquid source 40, membrane contactor 50, process chamber 60, and megasonic energy source 70. While megasonic energy source 70 is illustrated as being coupled to the bottom of process chamber 60, the invention is not limited to any specific orientation of megasonic energy source 70 with respect to process chamber 60 so long as megasonic energy source 60 can supply megasonic energy to a semiconductor wafer (not illustrated) supported within process chamber 60.

In using megasonic cleaning system 10 to clean a semiconductor wafer according to an embodiment of the present invention, a cleaning liquid, such as as commonly used semiconductor solutions including deionized water, RCA solutions, dilute acids, dilute bases or semi-aqueous solvents is first supplied from cleaning liquid source 40 to membrane contactor 50 via fluid line 41. Other cleaning liquids can be used with the present invention, including but not limited to other RCA cleaning fluids. Simultaneously, $CO_2$ gas is supplied from $CO_2$ gas source 20 to membrane contactor 50 via fluid line 21 and $N_2$ gas is supplied from $N_2$ gas source 30 to membrane contactor 50 via fluid line 31. Membrane contactor 50 functions to dissolve the $CO_2$ gas and the $N_2$ gas into the cleaning liquid to form a cleaning solution. It should be noted that while the invention is described in detail with respect to dissolving $CO_2$ and $N_2$ gases in the cleaning liquid, the invention is not so limited. One of the gases is preferably of a type that promotes good particle removal, such as nitrogen ($N_2$), oxygen ($O_2$) helium (He), argon (Ar) and others. The other of the gases is preferably of a type that protects a semiconductor wafer from being damaged from the effects of megasonic energy exposure. A preferred example of such a gas is $CO_2$. Moreover, while the gases may be dissolved into the cleaning liquid using a membrane contactor, other known methods and apparatus of dissolving gases into liquids can be used.

A gaseous environment having a controlled temperature and pressure is maintained in the membrane contactor 50 during dissolution of the $CO_2$ and $N_2$ gases into the cleaning liquid. The temperature and partial pressures of $CO_2$ and $N_2$ in the gaseous environment in membrane contactor 50 are controlled so that more $CO_2$ gas and $N_2$ gas will dissolve into the cleaning liquid in the membrane contactor 50 than otherwise would in the gaseous environment maintained in process chamber 60. Thus, while the amount of $CO_2$ and $N_2$ gases dissolved in the cleaning liquid in the membrane contactor 50 is at or below the saturation concentration for the temperature and partial pressures of the gaseous environment within the membrane contactor 50, this amount of dissolved $CO_2$ and $N_2$ gases in the cleaning liquid would be above the saturation concentration for the temperature and partial pressures of the gaseous environment within the process chamber 60.

For example, consider a gaseous environment in membrane contactor 50 containing only $N_2$ and $CO_2$ at a 1:1 volumetric ratio, and a gaseous environment in process chamber 60 containing only air. Assuming both gaseous environments are at atmospheric pressure and room temperature, the partial pressure of the $CO_2$ in the gaseous environment of membrane contactor 50 is greater than the partial pressure of the $CO_2$ in the gaseous environment of the process chamber 60. Therefore, at equilibrium, the concentration of $CO_2$ dissolved in a cleaning liquid exposed to the gaseous environment of membrane contactor 50 will be greater than the concentration of $CO_2$ in the cleaning liquid exposed to the gaseous environment of process chamber 60. The same principles hold true for the dissolved $N_2$ gas.

After the desired amount of $CO_2$ and $N_2$ gases are dissolved into the cleaning liquid to form the desired cleaning solution, the cleaning solution is introduced into process chamber 60 via fluid line 51. Upon entering process chamber 60, the cleaning solution contacts the wafer (or wafers) supported therein. Process chamber 60 preferably contains air at atmospheric pressure and room temperature. Thus, when the cleaning solution reaches process chamber 60, one or more of the dissolved gases (i.e. the $CO_2$ gas or the $N_2$ gas) in the cleaning solution are well above the saturation concentration. As such, the dissolved gases that are above the saturation concentration for the temperature and respective partial pressure of the gaseous environment of process chamber 60 will have a tendency to escape from the cleaning solution. However, wafer processing/cleaning (as described below) is preferably completed before enough of the gas can escape the cleaning solution to return the amount of the gas in the cleaning solution to the saturation concentration.

In a preferred embodiment, the $CO_2$ concentration in the cleaning solution is 1000 ppm, which is more than 1000 times the saturation concentration of $CO_2$ in air at atmospheric pressure and room temperature. Experiment has shown this concentration of $CO_2$ to produce very efficient cleaning with no wafer damage when used in conjunction with applied megasonic energy.

Once the cleaning solution is supplied to process chamber 60 and is in contact with a semiconductor wafer (or wafers) in process chamber 60, megasonic energy source 70 is activated. Depending on the type of process chamber used, the semiconductor wafer(s) may be immersed in the cleaning solution or, in the event of a single-wafer process chamber, a layer of the cleaning solution may be applied to one or more of the wafer's surfaces. The present invention is not limited to a specific type of process chamber. Additionally, the megasonic energy source is not limited to any particular shape and/or orientation. For example, the megasonic energy source can be plate-like, an elongated rod, triangularly shaped, or otherwise. The present invention can even be used in conjunction with the application of ultrasonic and other forms of acoustical energy application.

Upon being activated, megasonic energy source 70 creates and transmits megasonic acoustical energy through the cleaning solution and to the semiconductor wafer (or wafers) to be cleaned. The dissolved $CO_2$ (and or the $N_2$) in the cleaning solution acts to protect the wafers being cleaned from being damaged by the megasonic energy being transmitted to the wafer surfaces. As a result, megasonic energy can be applied to semiconductor wafers in cleaning processes subsequent to the wafer taking on a sensitive nature, such as as after etching of lines or trenches of materials including poly silicon, metal or dielectric.

Figure 4A:
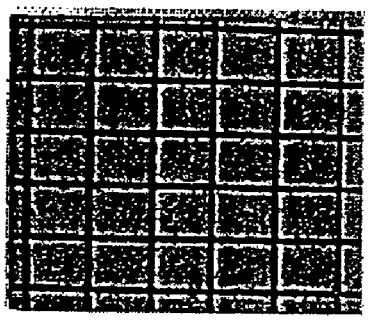
FIG. 4A is a microscopic image of a damaged semiconductor wafer surface with etched lines that was cleaned using prior art megasonic cleaning process.
Figure 4A:
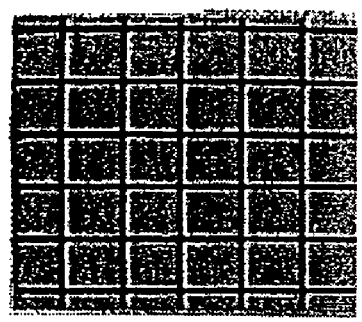

Comparison of FIG. 4A with FIG. 4B illustrates the advantageousness of using a supersaturated amount of $CO_2$ as one of the gases dissolved in the cleaning solution. FIGS. 4A and 4B represent damage evaluations of sensitive bitline structures using a microscope. The dark spots in the figures indicate wafer damage. FIG. 4A. illustrates wafer damage resulting from using a cleaning solution having a saturated concentration of air. Cleaning efficiency is approximately 99%, but the wafer has sustained significant damage. FIG. 4B illustrates wafer damage resulting from using a cleaning solution having a supersaturated concentration of $CO_2$ according to an embodiment of the invention. Cleaning efficiency is again approximately 99%, but the wafer has sustained no damage. In the processes used to clean the wafers illustrated in FIGS. 4A and 4B megasonic conditions were identical, and, except for the concentrations of dissolved gases, the cleaning solutions were identical.

As discussed above, the present invention can be practiced in conjunction with a variety of types of process chambers, including single wafer or batch process chambers and/or immersion or non-immersion process chambers. For illustration, a single wafer non-immersion type process chamber will be discussed with the understanding that the inventive principles are equally applicable to batch type immersion process tanks.

Figure 2:
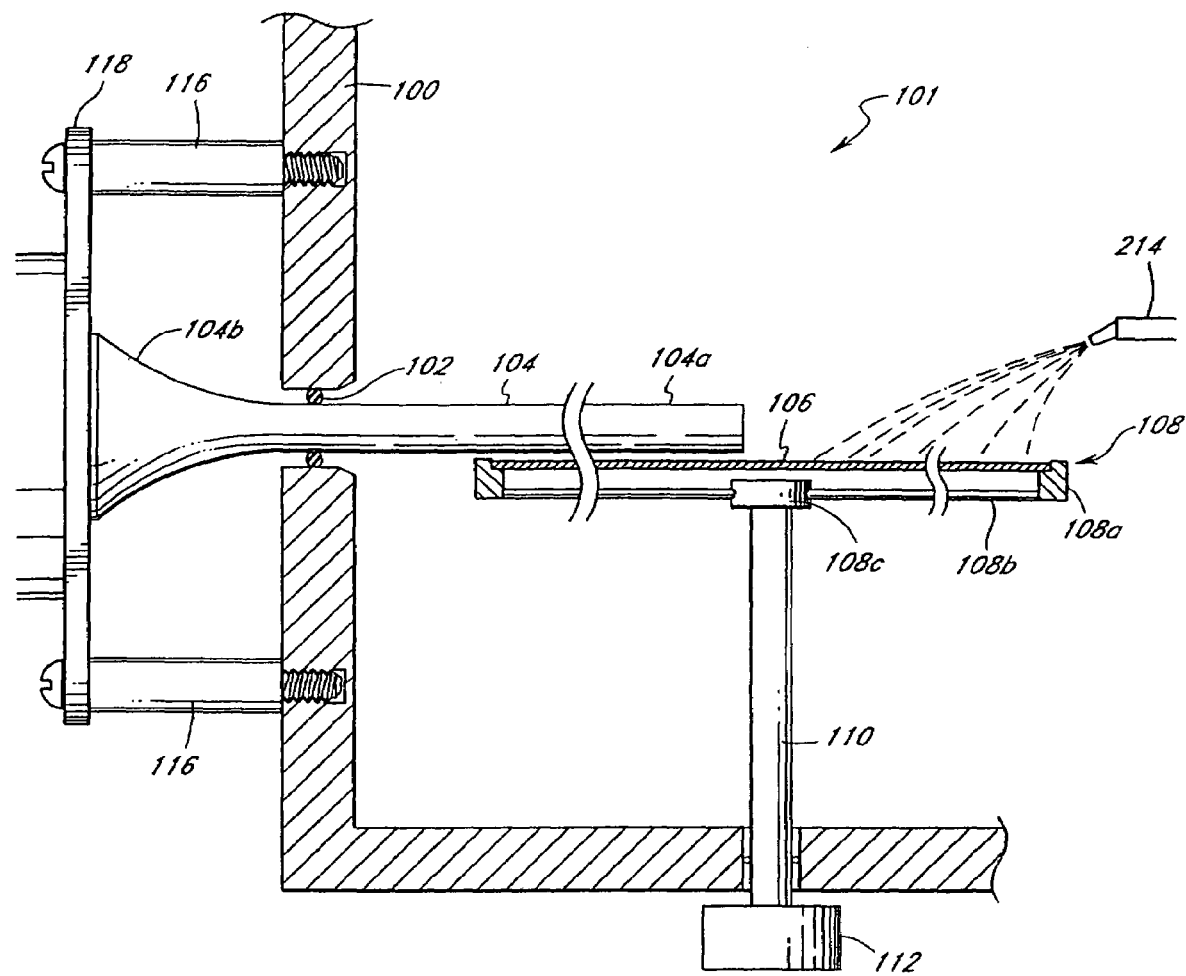
FIG. 2 is a left side view of a non-immersion single wafer megasonic cleaning apparatus according to an embodiment of the present invention.

FIG. 2 illustrates single wafer non-immersion megasonic energy cleaning apparatus 101, made in accordance with the present invention. The cleaning solution created as described in relation to FIG. 1 is supplied to the wafer 106 via fluid outlet 214 to form a thin layer on the wafer surface. Alternatively, the cleaning solution can also be applied to the bottom surface of the wafer 106 also. Fluid outlet 214 can be fluidly coupled to fluid line 51 (FIG. 1). Megasonic energy cleaning apparatus 101 comprises an elongated probe 104 inserted through the wall 100 of a processing tank 101. The process tank 101 forms a process chamber within which a wafer 106 can be processed according to the present invention As seen, the probe 104 is supported on one end outside the container 101. A suitable O-ring 102, sandwiched between the probe 104 and the tank wall 100, provides a proper seal for the processing tank 101.

A heat transfer member 134, contained within a housing 120, is acoustically and mechanically coupled to the probe 104. Also contained within the housing 120 is a piezoelectric transducer 140 acoustically coupled to the heat transfer member 134. Stand off 141, and electrical connectors 142, 154, and 126 are connected between the transducer 140 and a source of acoustic energy (not shown). The housing 120 supports an inlet conduit 124 and an outlet conduit 122 for coolant and has an opening 152 for electrical connectors 154, and 126. The housing 120 is closed by an annular plate 118 with an opening 132 for the probe 104. The plate 118 in turn is attached to the tank 101. Within the processing tank 101, a support or susceptor 108 is positioned parallel to and in close proximity to the probe 104. The susceptor 108 may take various forms, the arrangement illustrated including an outer rim 108a supported by a plurality of spokes 108b connected to a hub 108c supported on a shaft 110, which extends through a bottom wall of the processing tank 101. Outside the tank 101, the shaft 110 is connected to a motor 112.

The elongated probe 104 is preferably made of a relatively inert, non-contaminating material, such as quartz, which efficiently transmits acoustic energy. While utilizing a quartz probe is satisfactory for most cleaning solutions, solutions containing hydrofluoric acid can etch quartz. Thus, a probe made of sapphire silicon carbide, boron nitride, vitreous carbon, glassy carbon coated graphite, or other suitable materials may be employed instead of quartz. Also, quartz may be coated by a material that can withstand HF such as silicon carbide or vitreous carbon.

The probe 104 comprises a solid, elongated, spindle-like or probe-like cleaning portion 104a, and a base or rear portion 104b. The cross-section of the probe 104 may be round and advantageously, the diameter of the cleaning portion 104a is smaller in diameter than the rear portion 104b. In a preferred embodiment the area of the rear face of the rear portion 104b is 25 times that of the tip face of portion 104a. Of course, cross-sectional shapes other than circular may be employed. A cylindrically-shaped rod or cleaning portion 104a having a small diameter is desirable to concentrate the megasonic energy along the length of the probe 104a. The diameter of the rod 104a, however, should be sufficient to withstand mechanical vibration produced by the megasonic energy transmitted by the probe. Preferably, the radius of the rod 104a should be equal to or smaller than the wavelength of the frequency of the energy applied to it. This structure produces a desired standing surface wave action that directs energy radially into liquid contacting the probe. In effect, the rod diameter is expanding and contracting a minute amount at spaced locations along the length of the rod. In a preferred embodiment, the radius of the rod 104a is approximately 0.2 inches and operates at a wave length of about 0.28 inches. This configuration produces 3 to 4 wave lengths per inch along the probe length.

The probe cleaning portion 104a is preferably long enough so that the entire surface area of the wafer 106 is exposed to the probe 104 during wafer cleaning. In a preferred embodiment, because the wafer 106 is rotated beneath the probe 104, the length of the cleaning portion 104b is preferably long enough to reach at least the center of the wafer 106. Therefore, as the wafer 106 is rotated beneath the probe 104, the entire surface area of the wafer 106 passes beneath the probe 104. The probe 104 could probably function satisfactorily even if it does not reach the center of the wafer 106 since megasonic vibration from the probe tip would provide some agitation towards the wafer center. The length of the probe 104 is also determined by a desired number of wavelengths. Usually, probe lengths vary in increments of half wavelengths of the energy applied to the probe 104. Preferably the probe cleaning portion 104a includes three to four wavelengths per inch of the applied energy. In this embodiment, the length of the probe cleaning portion 104a in inches is equal to the desired number of wavelengths divided by a number between three and four. Due to variations in transducers, it is necessary to tune the transducer 140 to obtain the desired wavelength, so that it works at its most efficient point.

Figure 3:
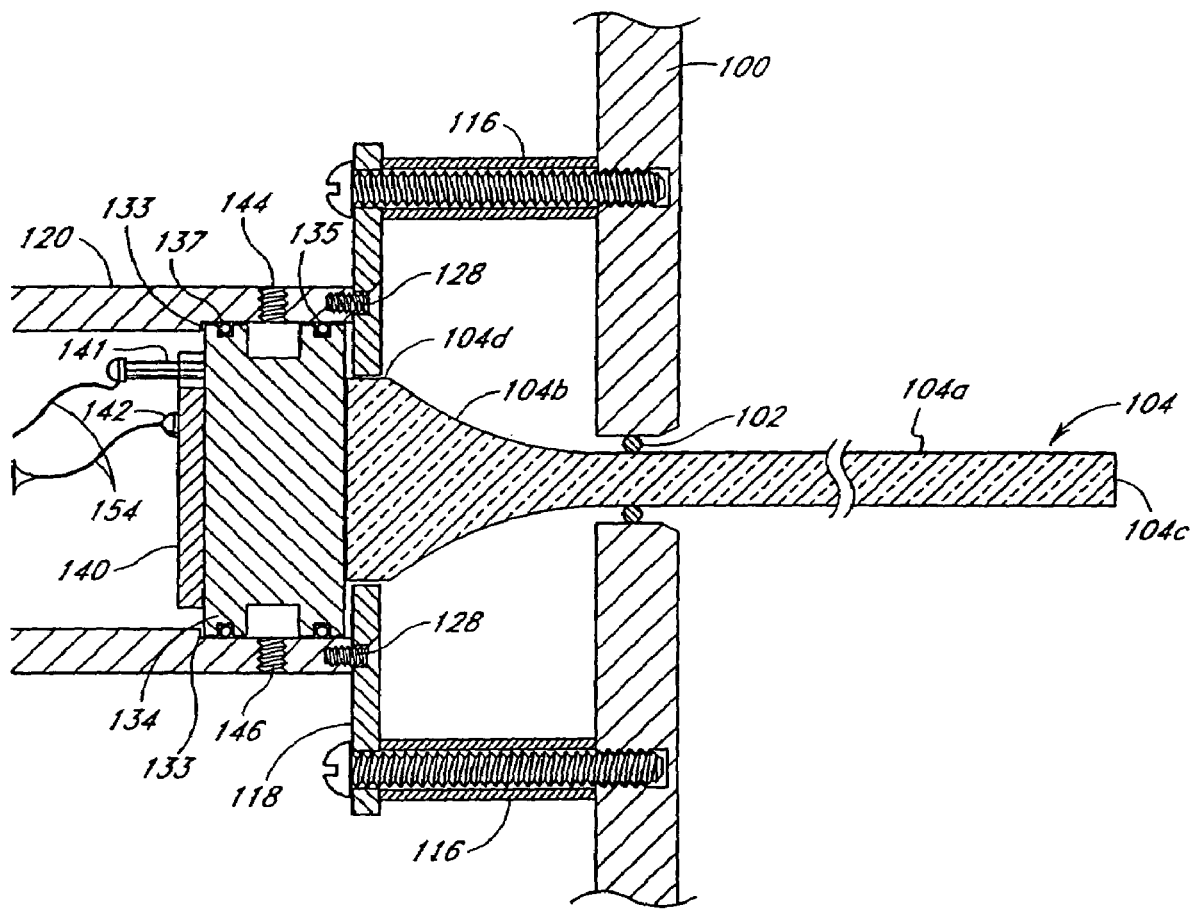
FIG. 3 is a left-side cross-sectional view of the apparatus shown in FIG. 2.

The rear probe portion 104b, which is positioned outside the tank 101, flares to a diameter larger than the diameter of the cleaning portion 104a. In the embodiment shown in FIGS. 2-3, the diameter of the rear portion of the probe gradually increases to a cylindrical section 104d. The large surface area at the end of the rear portion 104d is advantageous for transmitting a large amount of megasonic energy, which is then concentrated in the smaller diameter section 104a.

In use, the cleaning solution (as created as described above with respect to FIG. 1) is sprayed onto the wafer upper surface from a nozzle 214 while the probe 104 is acoustically energized. As an alternative to spraying the cleaning solution onto the wafer 106 from a nozzle, the tank 101 may be filled with cleaning solution. In the spray-on method, the liquid creates a meniscus 216 between the lower portion of the probe 104 and the adjacent upper surface of the rotating wafer 106. The meniscus 216 wets a lower portion of the probe cross section. The size of the arc defined by the wetted portion of the cross-section varies according to the properties of the liquid used in the cleaning solution, the material used to construct the probe 104, and the vertical distance between the wafer 106 and the lower edge of the probe 104.

The cleaning solution provides a medium through which the megasonic energy within the probe 104 is transmitted to the wafer surface to loosen particles. These loosened particles are flushed away by the continuously flowing spray and the rotating wafer 106. When the liquid flow is interrupted, a certain amount of drying action is obtained through centrifugal force, with the cleaning solution being thrown from the wafer 106. Alternatively, the cleaning solution of the present invention, or another cleaning medium can be supplied to the opposite side of the wafer at which the source of megasonic energy is positioned. In this embodiment, it is preferable that the megasonic energy be supplied to the wafer in sufficient power to clean the opposite side of the wafer also.

As discussed above, the wafer processing/cleaning through the application of the megasonic energy is completed before enough of the $CO_2$ and/or $N_2$ gas can escape the cleaning solution to return the amount of these gases in the cleaning solution to the saturation concentration. The dissolved $CO_2$ (and/or the $N_2$) in the cleaning solution at a supersaturation concentration acts to protect the wafers being cleaned from being damaged by the megasonic energy being transmitted to the wafer surfaces. All functions are carried out by a properly programmed processor/controller.

While the invention has been described and illustrated in sufficient detail that those skilled in this art can readily make and use it, various alternatives, modifications, and improvements should become readily apparent without departing from the spirit and scope of the invention. Specifically, the invention is not limited to the introduction of two gases into the cleaning liquid but encompasses embodiments where only one gas is dissolved in the cleaning liquid at a supersaturated concentration for the environment in the process chamber. Moreover, additional gases can exist in the cleaning liquid and/or the cleaning liquid can be a mixture of liquids.

The invention claimed is:

1. A method of cleaning at least one semiconductor wafer comprising:
   (a) positioning a semiconductor wafer in a process chamber;
   (b) supplying a solution to the process chamber so as to contact the substrate, the solution comprising a cleaning liquid and a first and second gases dissolved in the cleaning liquid, wherein the first gas promotes particle removal from the wafer and the second gas protects the wafer from damage resulting from acoustical energy; and
   (c) applying acoustical energy through the solution and to the wafer to clean the wafer;
   wherein the second gas is carbon dioxide and the process chamber comprises a gaseous environment at a first temperature and a first partial pressure of carbon dioxide, the carbon dioxide dissolved in the cleaning liquid at a supersaturated concentration for the first temperature and the first partial pressure.

2. The method of claim 1 wherein the first gas is selected from the group consisting of nitrogen, oxygen, helium, and argon.

3. The method of claim 1 further comprising:
   prior to step b), dissolving the carbon dioxide in the liquid in an environment having a second temperature and a second partial pressure of carbon dioxide, wherein the carbon dioxide is dissolved in an amount such that the carbon dioxide is at or below a saturation concentration for the second temperature and second partial pressure.

4. The method of claim 3 wherein step (c) is completed before enough of the carbon dioxide escapes from the solution to lower the concentration of the carbon dioxide dissolved in the liquid to a saturation concentration for the first temperature and first partial pressure.

* * * * *